United States Patent
Murakami

(10) Patent No.: US 6,499,994 B1
(45) Date of Patent: Dec. 31, 2002

(54) HEATING APPARATUS IN REFLOW SYSTEM

(75) Inventor: Takehiko Murakami, Inagi (JP)

(73) Assignee: Minami Co., Ltd., Tokyo (JP)

(*) Notice: Subject to any disclaimer, the term of this patent is extended or adjusted under 35 U.S.C. 154(b) by 0 days.

(21) Appl. No.: 09/994,217

(22) Filed: Nov. 26, 2001

(51) Int. Cl.[7] .................................................. F27B 9/02
(52) U.S. Cl. .................... 432/125; 432/128; 228/180.1; 219/85.17
(58) Field of Search .................................. 432/123, 125, 432/128, 131, 48, 200; 228/180.1, 180.21, 232; 219/85.1, 85.17, 388, 391

(56) References Cited

U.S. PATENT DOCUMENTS

| | | | | |
|---|---|---|---|---|
| 5,193,735 A | * | 3/1993 | Knight | 219/388 |
| 5,358,166 A | * | 10/1994 | Mishina et al. | 228/232 |
| 6,168,064 B1 | * | 1/2001 | Berkin | 219/388 |

* cited by examiner

Primary Examiner—Gregory Wilson
(74) Attorney, Agent, or Firm—ZITO tLp; Joseph J. Zito; Kendal M. Sheets

(57) ABSTRACT

To save a space for heating remarkably than that of a conventional case, to apply main heating at a high temperature only to portions of chips to be soldered and to perform heating operation in a short period of time, a heating apparatus is composed of a preheating zone and a main heating zone. In the preheating zone, support pallets are rotated in the vertical direction within a vertical heat insulating chamber like a Ferris wheel. Also, heat at a temperature such that cream solder is not molten by heaters is applied to a printed circuit board by fans. In the main heating zone, a pattern mask is fixed within a heat insulating chamber, sleeve bodies are fitted in necessary through-holes, blind plugs are fitted in unnecessary through-holes and heat at a temperature such that the cream solder is molten by a heater is applied to portions of chips to be soldered by fans through sleeve bodies, coil springs and other sleeve bodies.

2 Claims, 2 Drawing Sheets

HEATING APPARATUS IN REFLOW SYSTEM

BACKGROUND OF THE INVENTION

The present invention relates to a heating apparatus in a reflow system.

In a loading apparatus to print substrates, cream solder is first printed in a predetermined pattern on a surface of a print substrate with a squeegee and a screen mask by means of a printing apparatus. Thereafter, chips that are electric parts are laid thereon, the cream solder is heated to melt and the chips are mounted on the printed substrate.

In such a process, the step for melting the cream solder and loading the chips on the printed substrate is referred to as a "reflow" apparatus. This is conventionally performed in a heating chamber having a relatively long length of 4 to 6 m.

However, since the heating chamber has a length up to 4 to 6 m in a lateral direction as a whole, a large installation space is required. Also, depending upon a chip, if it is heated for a long period of time at a high temperature, there occurs a problem that it becomes fragile, and, in this case, all the large number of printed substrates simultaneously become the faulty products.

SUMMARY OF THE INVENTION

In view of the foregoing defects, an object of the present invention is to provide a heating apparatus that the space needed for heating may be remarkably reduced than that of the conventional case, main heating at a high temperature is applied only to the portion to be soldered in the chips and only a short period of time needs for the heating.

According to the present invention, in order to attain this object, there is provided a heating apparatus in a reflow system, comprising a preheating zone for performing heating at a temperature lower than a melting temperature of cream solder, in which a rope laid between a drive pulley and a driven pulley whose rotation speed may be controlled is vertically disposed within a vertical heat insulating chamber in which an inlet and an outlet are provided in vertical walls on both sides and a feeding conveyor and a receiving/sending conveyor are provided in the inlet and the outlet respectively, support pallets are attached to said rope at a predetermined interval, a plurality of heaters are provided in a central position of the rope in a vertical direction, vanes for introducing heat of the heaters to the support pallets are provided, and fans are disposed above the heaters, and a main heating zone in which an inlet and an outlet are provided in vertical wall on both sides, a pattern mask in which a number of through-holes are formed is fixed horizontally within a heat insulating chamber having an inlet in communication with the outlet of the heat insulating chamber in the preheating zone, a heater is disposed above the pattern mask, fans are disposed above the heater, sleeve bodies having flanges are fitted in necessary through-holes of the pattern mask, one end of a coil spring having the other end engaged with a sleeve body having a flange is fitted with the former sleeve body, a conveyor moving in the horizontal direction is disposed below the sleeve bodies, and heat at a temperature for melting the cream solder by the heater is applied to portions where the cream solder has been coated, through the sleeve bodies and the coil springs by the fans.

Also, in the above-described arrangement, it is possible to provide a shutter moving in a horizontal direction at a predetermined timing to enter below the sleeve bodies for interrupting the application of heated air blow.

DESCRIPTION OF THE PREFERRED EMBODIMENTS

An embodiment of the present invention will now be described with reference to the accompanying drawings.

Figure 1:
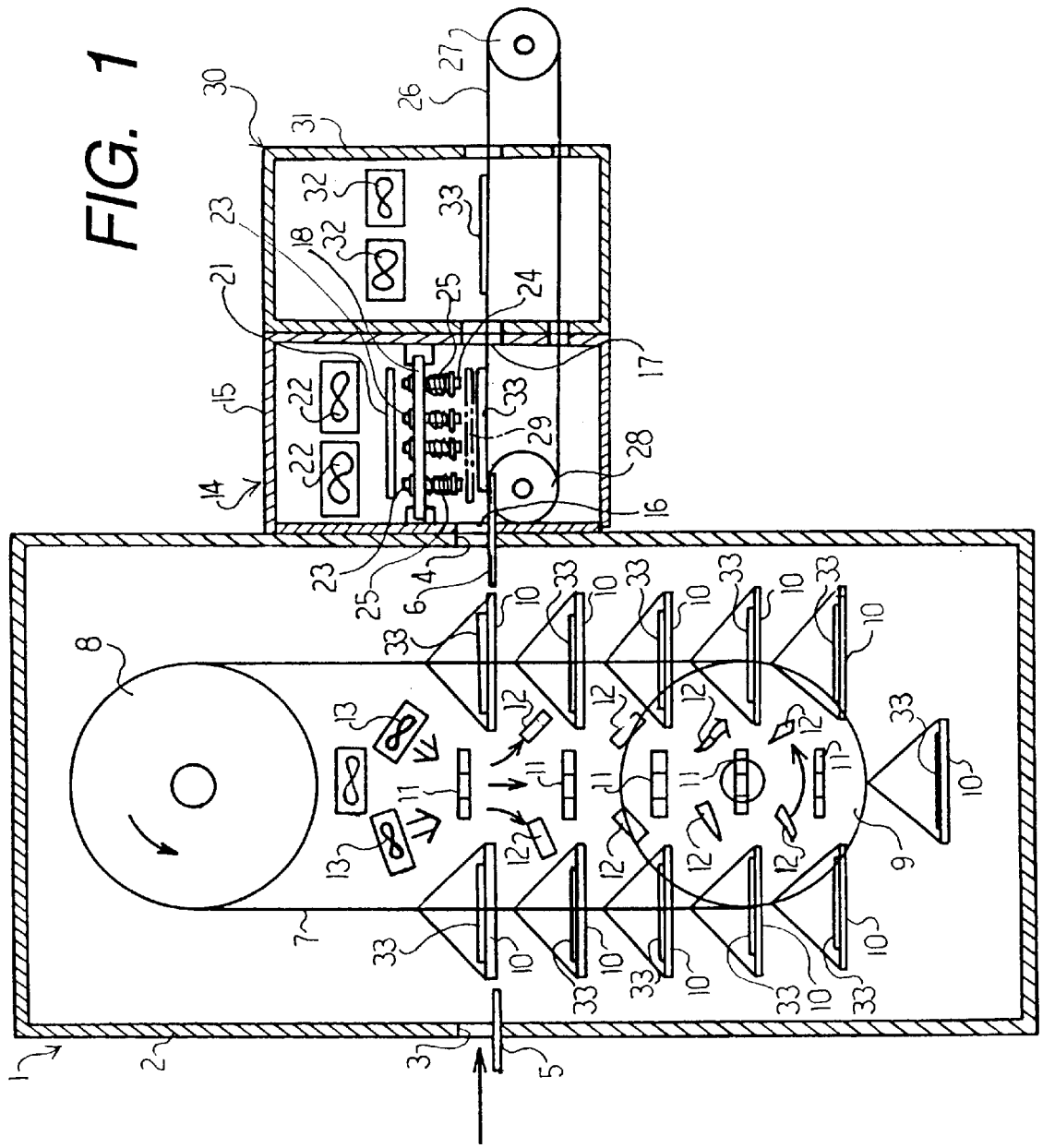
FIG. 1 is a schematic illustration of the overall system.
Figure 2:
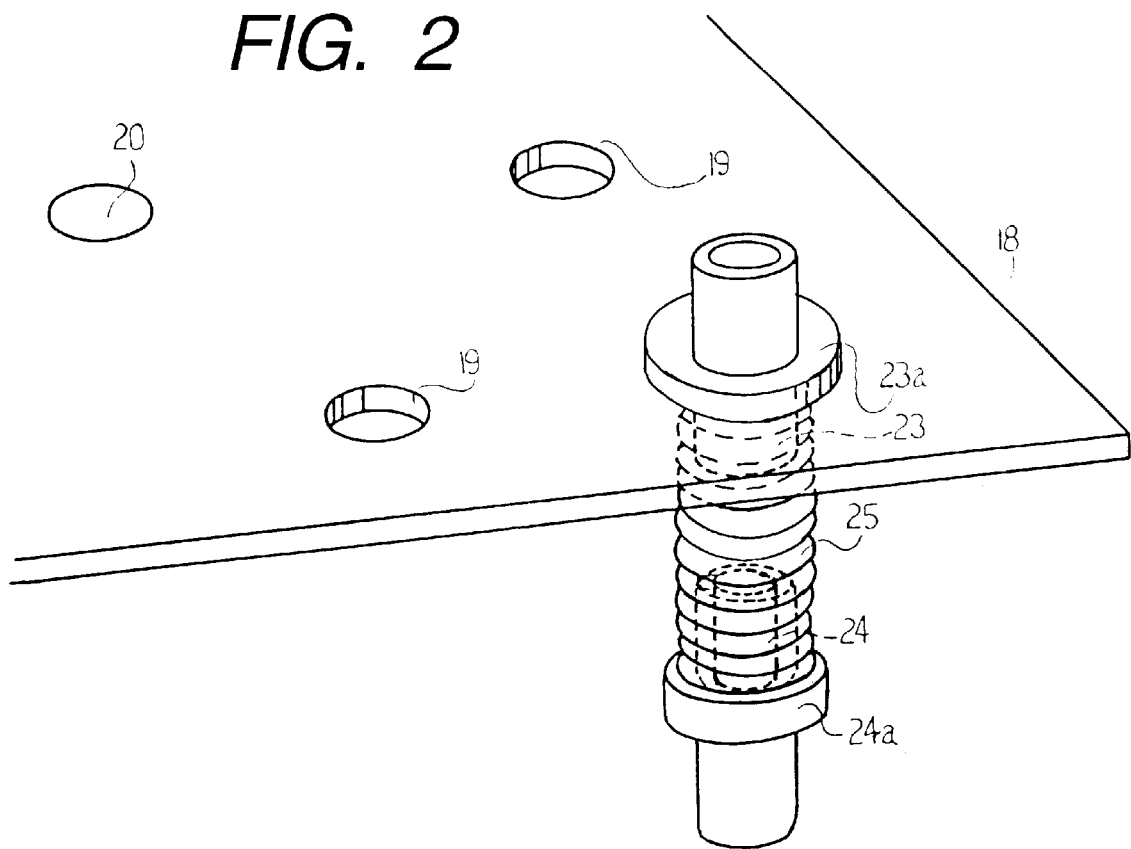
FIG. 2 is a perspective view of a pattern mask, a sleeve and a coil spring.
Figure 3:
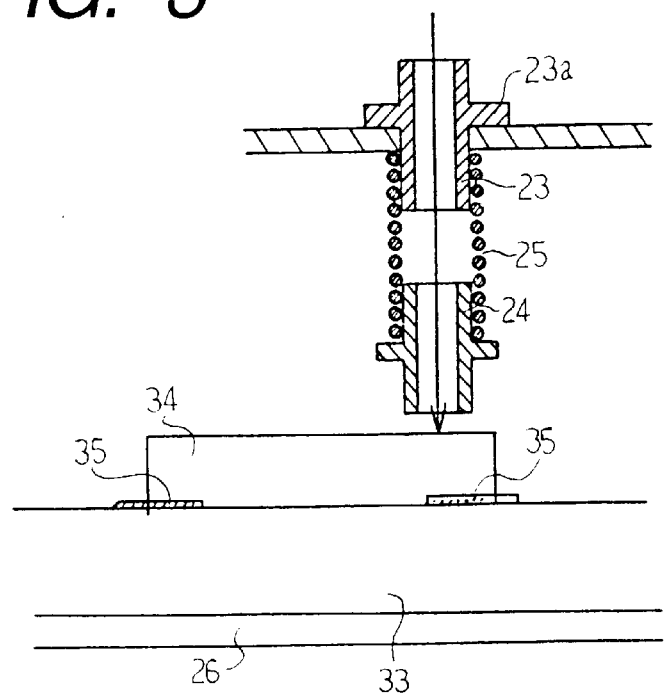
FIG. 3 is an illustration of the operation applying heated air blow.

FIG. 1 is a schematic illustration of the overall system, FIG. 2 is a perspective view of a pattern mask, a sleeve and a coil spring, and FIG. 3 is an illustration of the operation applying heated air blow.

In the drawings, numeral 1 denotes a preheating zone for performing heating at a lower temperature than a melting temperature of a solder cream. Numeral 2 denotes a vertical heat insulating chamber in which an inlet 3 and an outlet 4 are provided on vertical walls on both sides, and an feeding conveyor 5 and a receiving/sending conveyor 6 are provided in the inlet 3 and the outlet 4 respectively. The length from the inlet 3 to the outlet 4 is about 1 m.

Numeral 7 denotes a rope arranged vertically within the heat insulating chamber 2. Also, the rope 7 is laid between a drive pulley 8 and a driven pulley 9 whose rotation speed may be controlled. Then, support pallets 10, 10, 10, . . . are mounted at a predetermined interval on the rope and are rotated like a Ferris wheel as shown in FIG. 1.

Numeral 11 denotes a plurality of heaters arranged in a central position of the rope 7 in the vertical direction. Numeral 12 denotes vanes provided between the adjacent heaters 11 for introducing the heat of the heaters to the support pallets 10. Numeral 13 denotes fans disposed above the heaters 11.

With such an arrangement, printed circuit boards to be processes are laid in order on the respective pallets 10 and are rotated slowly at a predetermined speed intermittently or continuously. Then, at this time, the heat of the respective heaters 11 is applied to the respective printed circuit board by the fans 13 to thereby perform the preheating. Incidentally, it is preferable that the temperature during the preheating is about 180° C. Since this preheating is performed while moving the printed circuit boards up and down, the space in the lateral direction may be saved.

Numeral 14 denotes a main heating zone for applying heat for melting cream solder. Numeral 15 denotes a heat insulating chamber having an inlet 16 and an outlet 17, the inlet 16 communicating with the outlet 4 of the heat insulating chamber 2 of the above-described preheating zone 1. The above-described receiving/sending conveyor 6 is inserted into the inlet 16. Incidentally, the length from the inlet 16 to an outlet 17 of the insulating chamber 15 is about 25 cm.

Reference numeral 18 denotes a pattern mask fixed horizontally in the above-described insulating chamber 15. A number of through-holes 19 are formed in the pattern mask. It is preferable that the through-holes 19 are formed universally so as to make it applicable to any pattern. Blind plugs 20 are fitted in unnecessary through-holes.

Numeral 21 denotes a heater disposed above the above-described pattern mask 18. Numeral 22 denotes fans disposed above the heater 21.

Numeral 23 denotes sleeve bodies having flanges 23a, which are to be fitted in the necessary through-holes 19 of the above-described pattern mask 18. Also, one end of each coil spring 25 whose other end is engaged with a sleeve body 24 having a flange 24a is fitted with the sleeve body 23. Numeral 26 denotes a conveyor disposed below the above-described sleeve bodies and moving in the horizontal direction. The moving speed may be controlled as desired. Numerals 27 and 28 denote pulleys to drive the conveyor 26.

The single printed circuit board that has been fed from the preheating zone 1 is processed within the main heating zone 14 at a time. The heat at the temperature for melting the cream solder by the heater 21 is applied through the sleeve bodies 23, the coil springs 25 and the sleeve bodies 24 by the fans 22 to the portions to be soldered in the chips of the printed circuit board laid on the conveyor 26. Incidentally, the above-mentioned heat is set at 26° C.

With such an arrangement, the application of the heat at a high temperature for melting the cream solder is limited to the portions of the chips to be soldered. It takes very short time for performing this step, since the main heating is done after the preheating.

Numeral 29 denotes a shutter. The shutter 29 is moved in the horizontal direction at a suitable timing when the faulty part to which the cream solder has not been applied or the like is fed in. The shutter 29 enters below the sleeve bodies 24 to interrupt the application of the heated air blow.

Numeral 30 denotes a cooling zone for cooling the printed circuit board. The cooling zone is provided continuous with the main heating zone 14. In the cooling zone 30, fans 32 for cooling are provided, within a chamber 31. Also, in the drawings, numeral 33 denotes the printed circuit board, numeral 34 denotes the chip and numeral 35 denotes the cream solder.

With the thus described structure, according to the present invention, it is possible to remarkably reduce the space needed for heating than the conventional case. Also, since the main heating at the high temperature is only applied to the portions to be soldered and, in addition, is performed in the condition after the preheating, the main heating may be performed in a very short period of time.

Further, it is possible to provide the shutter for entering below the sleeve bodies and interrupting the application of the heated air blow. In this case, it is possible to prevent the heating at the high temperature when the faulty part to which the cream solder has not been applied has been fed and so on.

Furthermore, since the single printed circuit board has been fed into the main heating zone, only the single faulty part is to be heated, even if it is done in the main heating zone.

What is claimed is:

1. A heating apparatus in a reflow system, comprising a preheating zone for performing heating at a temperature lower than a melting temperature of cream solder, in which a rope laid between a drive pulley and a driven pulley whose rotation speed may be controlled is vertically disposed within a vertical heat insulating chamber in which an inlet and an outlet are provided in vertical walls on both sides and a feeding conveyor and a receiving/sending conveyor are provided in the inlet and the outlet respectively, support pallets are attached to said rope at a predetermined interval, a plurality of heaters are provided in a central position of said rope in a vertical direction, vanes for introducing heat of the heaters to the support pallets are provided, and fans are disposed above the heaters, and a main heating zone in which an inlet and an outlet are provided in vertical wall on both sides, a pattern mask in which a number of through-holes are formed is fixed horizontally within a heat insulating chamber having an inlet in communication with the outlet of the heat insulating chamber in said preheating zone, a heater is disposed above the pattern mask, fans are disposed above the heater, sleeve bodies having flanges are fitted in necessary through-holes of said pattern mask, one end of a coil spring having the other end engaged with a sleeve body having a flange is fitted with the former sleeve body, a conveyor moving in the horizontal direction is disposed below the sleeve bodies, and heat at a temperature for melting the cream solder by the heater is applied to portions where the cream solder has been coated through the sleeve bodies and the coil springs by the fans.

2. The heating apparatus in a reflow system as claimed in claim 1, further comprising a shutter moving in a horizontal direction at a predetermined timing to enter below the sleeve bodies for interrupting the application of heated air blow.

* * * * *